(12) United States Patent
Kundu et al.

(10) Patent No.: US 10,605,863 B2
(45) Date of Patent: Mar. 31, 2020

(54) MAPPING PHYSICAL SHIFT FAILURES TO SCAN CELLS FOR DETECTING PHYSICAL FAULTS IN INTEGRATED CIRCUITS

(71) Applicant: Synopsys, Inc., Mountain View, CA (US)

(72) Inventors: Subhadip Kundu, Bangalore (IN); Parthajit Bhattacharya, Bangalore (IN); Rohit Kapur, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 156 days.

(21) Appl. No.: 15/796,423

(22) Filed: Oct. 27, 2017

(65) Prior Publication Data

US 2018/0267098 A1     Sep. 20, 2018

(30) Foreign Application Priority Data

Mar. 16, 2017   (IN) .............................. 201741009120

(51) Int. Cl.
*G01R 31/3177* (2006.01)
*G01R 31/3185* (2006.01)
*G01R 31/3183* (2006.01)
*G06F 17/50* (2006.01)

(52) U.S. Cl.
CPC . *G01R 31/3177* (2013.01); *G01R 31/318342* (2013.01); *G01R 31/318364* (2013.01); *G01R 31/318566* (2013.01); *G06F 17/5022* (2013.01)

(58) Field of Classification Search
CPC ........ G01R 31/3177; G01R 31/318566; G01R 31/318364; G01R 31/318342; G06F 17/50
See application file for complete search history.

(56) References Cited

U.S. PATENT DOCUMENTS

| 7,509,551 | B2 | 3/2009 | Koenemann et al. |
| 8,280,687 | B2 | 10/2012 | Cheng et al. |
| 8,280,688 | B2 | 10/2012 | Huang et al. |
| 8,448,032 | B2 | 5/2013 | Sharma et al. |
| 9,057,762 | B1 | 6/2015 | Huang et al. |
| 9,110,138 | B2 * | 8/2015 | Guo .............. G01R 31/318525 |
| 9,519,026 | B2 * | 12/2016 | Li .................. G01R 31/318566 |
| 9,568,550 | B1 | 2/2017 | Kundu et al. |
| 2005/0081130 | A1 * | 4/2005 | Rinderknecht ............................ G01R 31/318547 714/726 |

(Continued)

OTHER PUBLICATIONS

Kundu, S. et al., "Handling Wrong Mapping: A New Direction Towards Better Diagnosis with Low Pin Convolution Compressors," International Test Conference, IEEE, 2016, pp. 1-7.

(Continued)

*Primary Examiner* — Thien Nguyen (74) *Attorney, Agent, or Firm* — Fenwick & West LLP (57) ABSTRACT

Information is received describing test response signals generated by scan cells of an integrated circuit and physical shift failures representing mismatches between the test response signals and expected test response signals of the integrated circuit. The test response signals are mapped to a subset of the scan cells associated with the physical shift failures. Fault simulation is performed for the mapped subset of the scan cells to identify physical faults located within the integrated circuit causing the physical shift failures.

20 Claims, 6 Drawing Sheets

(56) References Cited

U.S. PATENT DOCUMENTS

| | | | | |
|---|---|---|---|---|
| 2005/0262409 | A1* | 11/2005 | Wang | G01R 31/318342 714/738 |
| 2007/0220381 | A1* | 9/2007 | Huang | G01R 31/318569 714/724 |
| 2007/0226570 | A1* | 9/2007 | Zou | G01R 31/318342 714/741 |
| 2009/0235132 | A1* | 9/2009 | Wang | G01R 31/318547 714/726 |
| 2010/0306606 | A1* | 12/2010 | Huang | G01R 31/318547 714/726 |
| 2011/0047426 | A1* | 2/2011 | Touba | G01R 31/318547 714/729 |
| 2011/0191643 | A1* | 8/2011 | Guo | G01R 31/318583 714/703 |
| 2011/0258501 | A1* | 10/2011 | Touba | G01R 31/318547 714/726 |
| 2013/0246869 | A1* | 9/2013 | Huang | G01R 31/318569 714/726 |
| 2015/0135030 | A1* | 5/2015 | Zou | G01R 31/318342 714/735 |

OTHER PUBLICATIONS

Kundu, S. et al., "Handling Wrong Mapping: A New Direction Towards Better Diagnosis with Low Pin Convolution Compressors," Powerpoint Presentation, ITC 2016, 24 pages.

Kundu, S. et al., "Fault Diagnosis in Designs with Extreme Low Pin Test Data Compressors," Design, Automation & Test in Europe Conference & Exhibition, EDAA, 2014, pp. 1285-1288.

Guo, R. et al., "A Technique for Fault Diagnosis of Defects in Scan Chains," Paper 10.2, ITC International Test Conference, IEEE, 2001, pp. 268-277.

* cited by examiner

MAPPING PHYSICAL SHIFT FAILURES TO SCAN CELLS FOR DETECTING PHYSICAL FAULTS IN INTEGRATED CIRCUITS

CROSS REFERENCE TO RELATED APPLICATION

This application claims the benefit of Indian Provisional Application No. 201741009120, filed Mar. 16, 2017, which is incorporated by reference in its entirety.

BACKGROUND

Field of the Disclosure

The present disclosure generally relates to fault diagnosis in integrated circuits, and specifically to mapping of physical shift failures to scan cells for identification of physical faults in integrated circuits.

Description of the Related Arts

A physical fault is an error introduced into an integrated circuit during a semiconductor manufacturing process. During testing of the integrated circuit, test patterns signals are applied to the integrated circuit and logic value outputs from the integrated circuit are observed. When the integrated circuit is operating as designed, the logic value outputs coincide with expected output values specified by the test pattern signals. A fault in the integrated circuit is detected when the logic value output is different than the expected output response.

Automatic Test Pattern Generation (ATPG) refers to an electronic design automation (EDA) process that generates test pattern signals for applying to an integrated circuit to detect faulty behavior caused by physical faults in the integrated circuit. The generated test pattern signals are used to test semiconductor devices after manufacture, and in some cases to assist with determining the cause of the physical fault.

An unknown value in the output of an integrated circuit is designated "X" to represent that it could be either a logic 0 or logic 1 in the expected output data stream. X response values in output of integrated circuits are generally undesirable because it is unknown whether the design is faulty based on the output. In standard scan testing without compression, X values are simply ignored. However, when scan data is compressed, X values can interfere with known values and reduce fault coverage. Moreover, due to fault aliasing and the presence of "don't care" values in the test response signals in the presence of test compression, identification of failing scan cells may not always be correct. Incorrect identification can introduce further errors into scan diagnosis and fault simulation, thereby leading to faulty scan diagnosis of physical faults in the integrated circuit.

SUMMARY

Embodiments relate to mapping physical shift failures, associated with faulty test response signals of an integrated circuit, to the scan cells from which the faulty test response signals are obtained on automatic test equipment (ATE). Scan diagnosis, including logic cone tracing and fault simulation, is performed to identify physical faults within the integrated circuit that cause the physical shift failures associated with the faulty test response signals.

In one embodiment, information is received describing test response signals generated by scan cells of an integrated circuit and physical shift failures representing mismatches between the test response signals and expected test response signals of the integrated circuit. The test response signals are mapped to a subset of the scan cells associated with the physical shift failures. Fault simulation is performed for the mapped subset of the scan cells to identify physical faults located within the integrated circuit causing the physical shift failures.

In one embodiment, the test response signals are obtained by compressing output signals of the scan cells using a convolutional compactor.

In one embodiment, the mapping of the test response signals to the subset of the scan cells includes identifying physical shift failures associated with distinct scan cells. The distinct scan cells are included in the subset of the scan cells.

In one embodiment, the mapping of the test response signals to the subset of the scan cells includes identifying physical shift failures associated with distinct scan cells. A distinct scan cell associated with a largest number of the physical shift failures associated with the distinct scan cells is identified. The identified distinct scan cell is included in the subset of the scan cells.

In one embodiment, the mapping of the test response signals to the subset of the scan cells includes identifying a scan cell associated with physical shift failures associated with a largest number of the test response signals. The identified scan cell is included in the subset of the scan cells.

In one embodiment, the identifying of the physical faults includes storing a fault list including potential faults located within the integrated circuit. Each potential fault is associated with one or more scan cells. Scores for the potential faults are determined based on a number of the one or more scan cells associated with physical shift failures. The scores are further based on a number of the one or more scan cells associated with simulation failures based on the performing of the fault simulation. When the scores exceed a threshold, the potential faults are reported as physical faults.

In one embodiment, the identifying of the physical faults includes storing a fault list comprising potential faults located within the integrated circuit. Each test response signal is associated with one or more of the potential faults. Hash values are determined for the test response signals based on physical shift failures associated with the test response signals. The one or more of the potential faults are reported as physical faults based on the hash values.

In one embodiment, the identifying of the physical faults includes storing a fault list including potential faults located within the integrated circuit. For each test response signal, hash values are determined based on the performing of the fault simulation. Each hash value corresponds to one or more of the potential faults. The one or more of the potential faults are reported as physical faults based on the hash values.

In one embodiment, the identifying of the physical faults includes storing a fault list including potential faults located within the integrated circuit. Simulation hash values are determined for the test response signals based on the performing of the fault simulation. Each simulation hash value corresponds to one or more of the potential faults. Physical hash values are determined based on physical shift failures associated with the test response signals. Responsive to a simulation hash value matching a physical hash value, the corresponding one or more of the potential faults are identified as physical faults.

BRIEF DESCRIPTION OF THE DRAWINGS

The teachings of the embodiments of the present invention can be readily understood by considering the following detailed description in conjunction with the accompanying drawings.

The figures depict various embodiments of the present invention for purposes of illustration only. One skilled in the art will readily recognize from the following discussion that alternative embodiments of the structures and methods illustrated herein may be employed without departing from the principles described herein.

DETAILED DESCRIPTION

In the following description of embodiments, numerous specific details are set forth in order to provide more thorough understanding. However, note that the present invention may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number corresponds to the figure in which the reference number is first used.

Embodiments relate to mapping physical shift failures, associated with faulty test response signals of an integrated circuit, to the scan cells from which the faulty test response signals are obtained on the ATE. Scan diagnosis, including logic cone tracing and fault simulation are performed to identify physical faults within the integrated circuit that cause the physical shift failures associated with the faulty test response signals.

Scan cells described herein refer to flip-flops or memory elements of the integrated circuit that have been designed to receive test pattern signals and generate scan output signals when the integrated circuit is being tested. Test response signals may be generated directly from the scan cells or generated using a compression circuit based on the scan output signals.

Physical shift failures described herein are incorrect logic values associated with the test response signals generated using the scan cells.

Logic cone tracing described herein refers to the identification of logic gates and internal nodes of an integrated circuit that are encountered during a back trace from scan cells through the logic of the circuit.

Fault simulation described herein refers to the process of applying test pattern signals to a software version of the integrated circuit while simulating a fault in the integrated circuit to determine the effects of the fault observed via the scan cells.

Scan diagnosis described herein refers to the functions of logic cone tracing and fault simulation to identify physical faults in the integrated circuit.

Physical faults described herein are manufacturing defects in the integrated circuit.

Overview of EDA Design Flow

Figure 1:
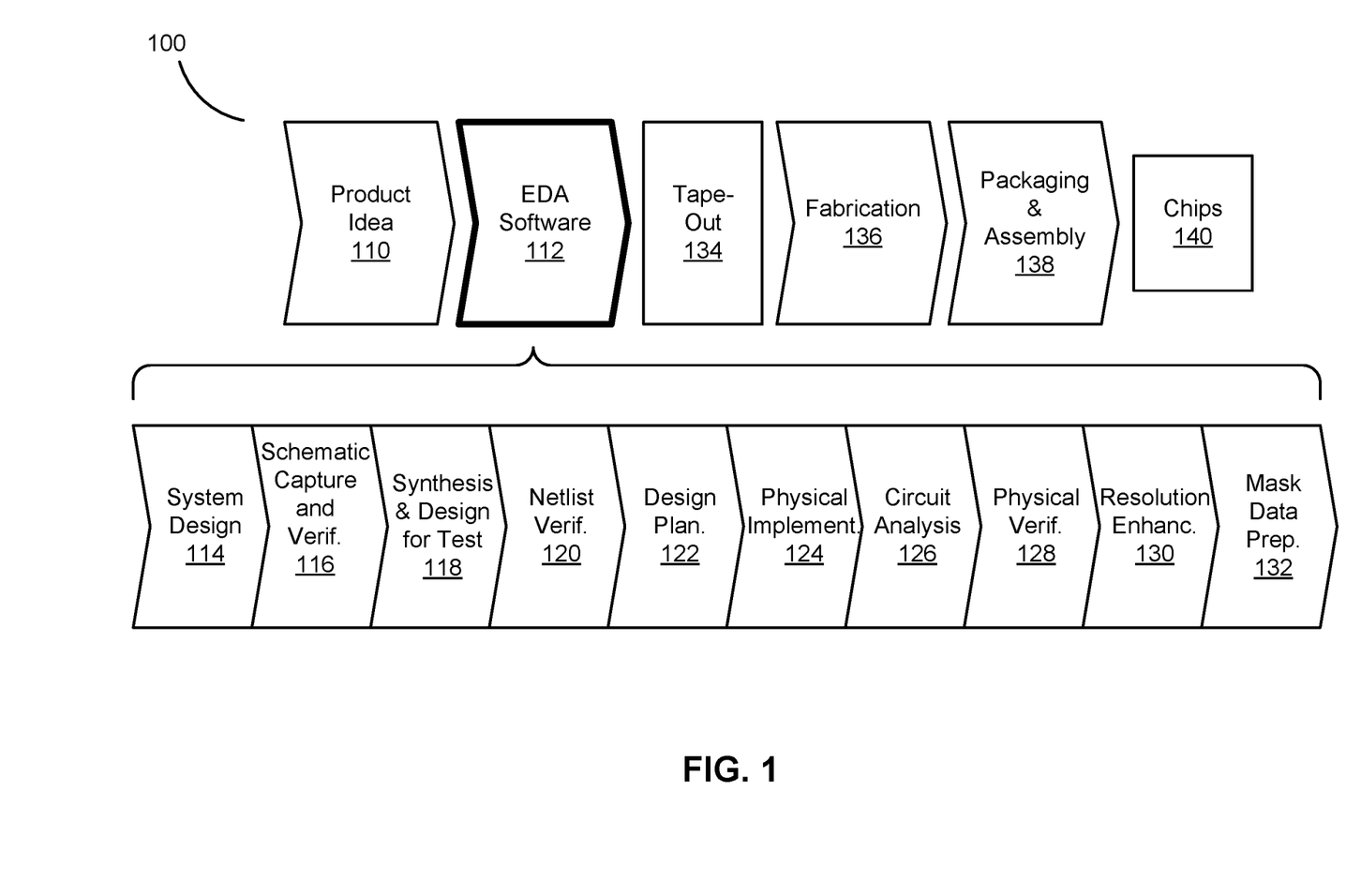
FIG. 1 is an example flow illustrating various operations for designing and fabricating an integrated circuit, in accordance with an embodiment.

FIG. 1 is an example flow 100 illustrating various operations for designing and fabricating an integrated circuit, in accordance with an embodiment. The design process 100 starts with the generation of a product idea 110, which is realized during a design process that uses electronic design automation (EDA) software 112. When the design is finalized, it can be taped-out 134. After tape-out 134, a semiconductor die is fabricated 136 to form the various objects (e.g., gates, metal layers, and vias) in the integrated circuit design. Packaging and assembly processes 138 are performed, which result in finished chips 140.

The EDA software 112 may be implemented in one or more computing devices such as the computing device 200, illustrated and described below with reference to FIG. 2. For example, the EDA software 112 is stored as instructions in a computer-readable medium which are executed by a processor for performing operations 114-132 of the design flow, which are described below. The EDA software may include the functions of ATPG, fault simulation, and scan cell design. This design flow description is for illustration purposes. In particular, this description is not meant to limit the present disclosure. For example, an actual integrated circuit design may require a designer to perform the design operations in a different sequence than the sequence described herein.

During system design 114, designers describe the functionality to implement. They can also perform what-if planning to refine the functionality and to check costs. Note that hardware-software architecture partitioning can occur at this stage. Example EDA software products from Synopsys, Inc. of Mountain View, Calif. that can be used at this stage include: Model Architect®, Saber®, System Studio®, and Designware® products.

During schematic capture and verification 116, VHDL or Verilog code for modules in the circuit are written and the design is checked for functional accuracy. More specifically, the design is checked to ensure that it produces the correct outputs. Scan cell design may be performed for the integrated circuit. Example EDA software products from Synopsys, Inc. of Mountain View, Calif. that can be used at this stage include: Custom Compiler®, VCS®, Vera®, 10 Designware®, Magellan®, Formality®, ESP® and Leda® products.

During synthesis and design for test 118, VHDL/Verilog is translated to a netlist. This netlist can be optimized for the target technology. Additionally, tests can be designed and implemented to check the finished chips. Fault simulation is performed. Example EDA software products from Synopsys, Inc. of Mountain View, Calif. that can be used at this stage include: Custom Compiler®, Design Compiler®, Physical Compiler®, Test Compiler®, Power Compiler®, FPGA Compiler®, Tetramax®, and Designware® products.

During netlist verification 120, the netlist is checked for compliance with timing constraints and for correspondence with the VHDL/Verilog source code. Example EDA software products from Synopsys, Inc. of Mountain View, Calif. that can be used at this stage include: Formality®, Primetime®, and VCS® products.

During design planning 122, an overall floor plan for the chip is constructed and analyzed for timing and top-level routing. Example EDA software products from Synopsys, Inc. of Mountain View, Calif. that can be used at this stage include: Astro® and IC Compiler® products.

During physical implementation 124, the placement (positioning of circuit elements) and routing (connection of the same) occurs. Example EDA software products from Synopsys, Inc. of Mountain View, Calif. that can be used at this stage include: Custom Compiler, the Astro® and IC Compiler® products. Embodiments described herein relate primarily to the physical implementation 124.

During circuit analysis 126, the circuit function is verified at a transistor level, which permits refinement. Example EDA software products from Synopsys, Inc. of Mountain View, Calif. that can be used at this stage include: Astrorail®, Primerail®, Primetime®, and Star RC/XT® products. During physical verification 128, the design is checked to ensure correctness for: manufacturing, electrical issues, lithographic issues, and circuitry.

During resolution enhancement 130, geometric manipulations of the layout are performed to improve manufacturability of the design. Example EDA software products from Synopsys, Inc. of Mountain View, Calif. that can be used at this stage include: Proteus®, Proteus®AF, and PSMGED® products.

During mask-data preparation 132, the 'tape-out' data for production of masks to produce finished chips is provided. Example EDA software products from Synopsys, Inc. of Mountain View, Calif. that can be used at this stage include the CATS® family of products.

Formal verification may be performed at the stage of logic design and functional verification 116. Low power design specification is typically processed during stages synthesis and design for test 118 or netlist verification 120.

Example Computing Device

Figure 2:
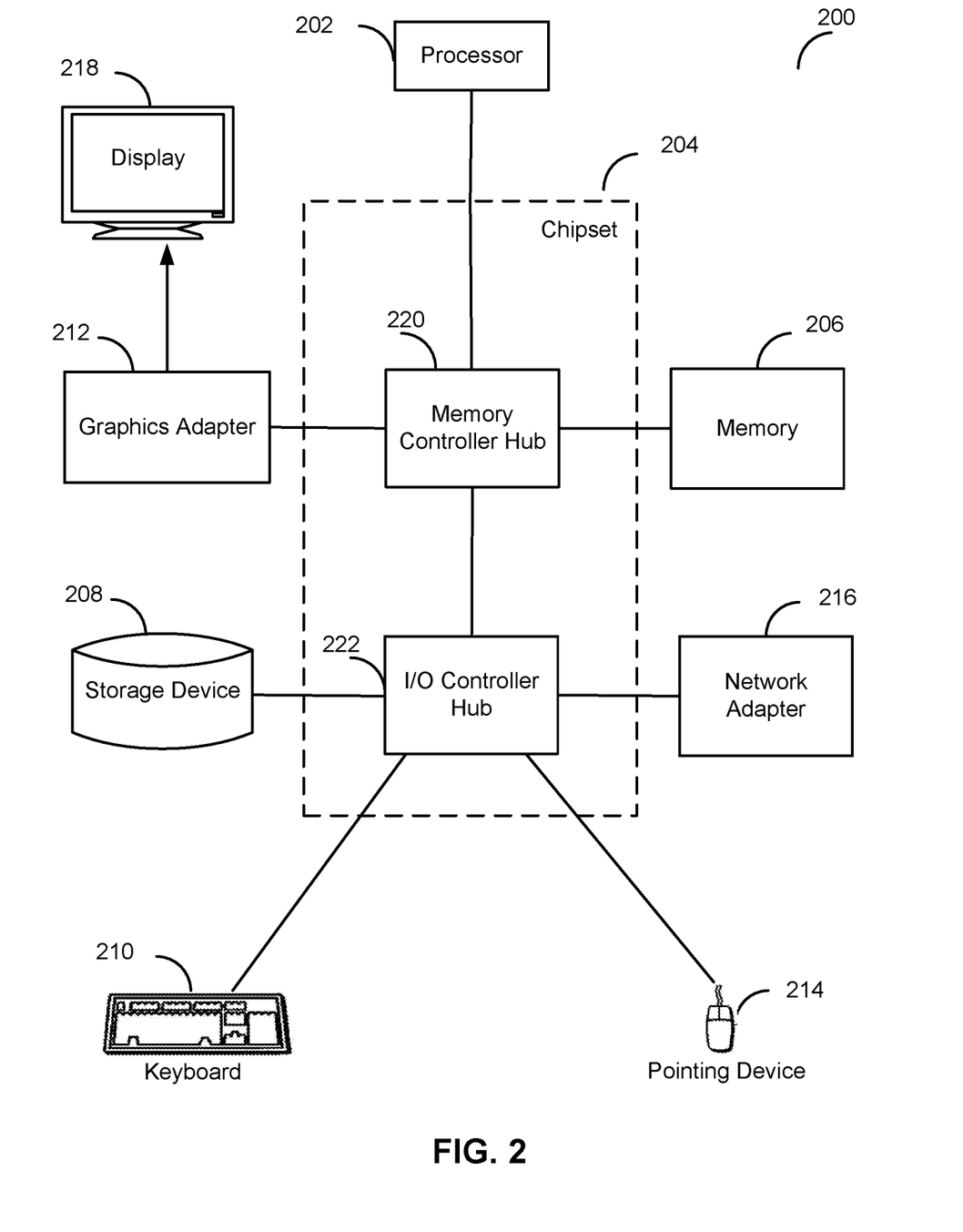
FIG. 2 is a high-level block diagram illustrating an example computing device for performing custom designing of a circuit, in accordance with an embodiment.

FIG. 2 is a high-level block diagram illustrating an example computing device 200 for designing an integrated circuit, in accordance with an embodiment. The computing device 200 includes at least one processor 202 coupled to a chipset 204. The chipset 204 includes a memory controller hub 220 and an input/output (I/O) controller hub 222. A memory 206 and a graphics adapter 212 are coupled to the memory controller hub 220, and a display 218 is coupled to the graphics adapter 212. A storage device 208, keyboard 210, pointing device 214, and network adapter 216 are coupled to the I/O controller hub 222. Other embodiments of the computing device 200 have different architectures.

The storage device 208 is a non-transitory computer-readable storage medium such as a hard drive, compact disk read-only memory (CD-ROM), DVD, or a solid-state memory device. The memory 206 holds instructions and data used by the processor 202. The pointing device 214 is a mouse, track ball, or other type of pointing device, and is used in combination with the keyboard 210 to input data into the computing device 200. The graphics adapter 212 displays images and other information on the display 218. The network adapter 216 couples the computing device 200 to one or more computer networks.

The computing device 200 is adapted to execute computer program modules for providing functionality described herein. As used herein, the term "module" refers to computer program logic used to provide the specified functionality. Thus, a module can be implemented in hardware, firmware, and/or software. In one embodiment, program modules are stored on the storage device 208, loaded into the memory 206, and executed by the processor 202. The types of computing devices 200 used can vary depending upon the embodiment and requirements. For example, a computing device may lack displays, keyboards, and/or other devices shown in FIG. 10.

The automatic test pattern generation and fault simulation engine 304 described in detail with reference to FIG. 3 below may be embodied by the computing device 200.

Example System for Testing and Diagnosing an Integrated Circuit

Figure 3:
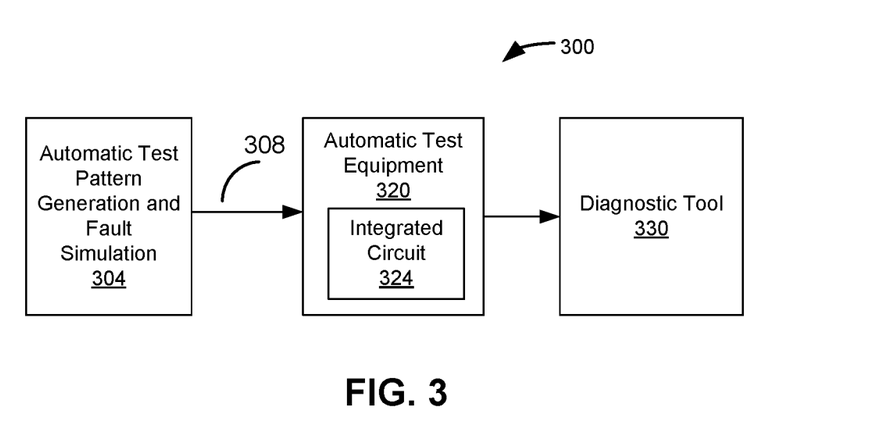
FIG. 3 is a block diagram illustrating a system for testing and diagnosing an integrated circuit, in accordance with an embodiment.

FIG. 3 is a block diagram illustrating an example system 300 for testing and diagnosing an integrated circuit 324, according to one embodiment. The integrated circuit 324 is being tested for faults in its fabrication process. The system 300 may include, among other components, an automatic test pattern generator/fault simulator 304, an ATE 320, and a diagnostic tool 330. One or more of these components may be combined into a single product or device.

The automatic test pattern generator/fault simulator 304 generates test pattern signals 304 provided to the ATE 320 and expected test response signals in the form of scan output signals corresponding to the test pattern signals for detecting faults in the integrated circuit 324. Scan output signals represent the expected output from a faultless integrated circuit when provided with the test pattern signals. A test pattern signal may include scan-in data and control data for controlling test operation in integrated circuit 324. The ATE 320 provides the test pattern signals 308 as scan-in data and control data to the integrated circuit 324, and receives test response signals from the integrated circuit 324. The received test response signals from the integrated circuit 324 are compared with scan-out values. ATE 320 generates physical shift failures representing mismatches between the test response signals and expected test response signals of the integrated circuit 324.

ATE 320 sends the physical shift failures and the test response signals to diagnostic tool 330 to localize and diagnose the cause of faults in integrated circuit 324. If a fault is detected based on an unexpected output of integrated circuit 324, diagnostic tool 330 may request the automatic test pattern generator/fault simulator 304 to generate further test patterns to localize or specify a scan cell associated with the unexpected value.

Example Integrated Circuit

Figure 4:
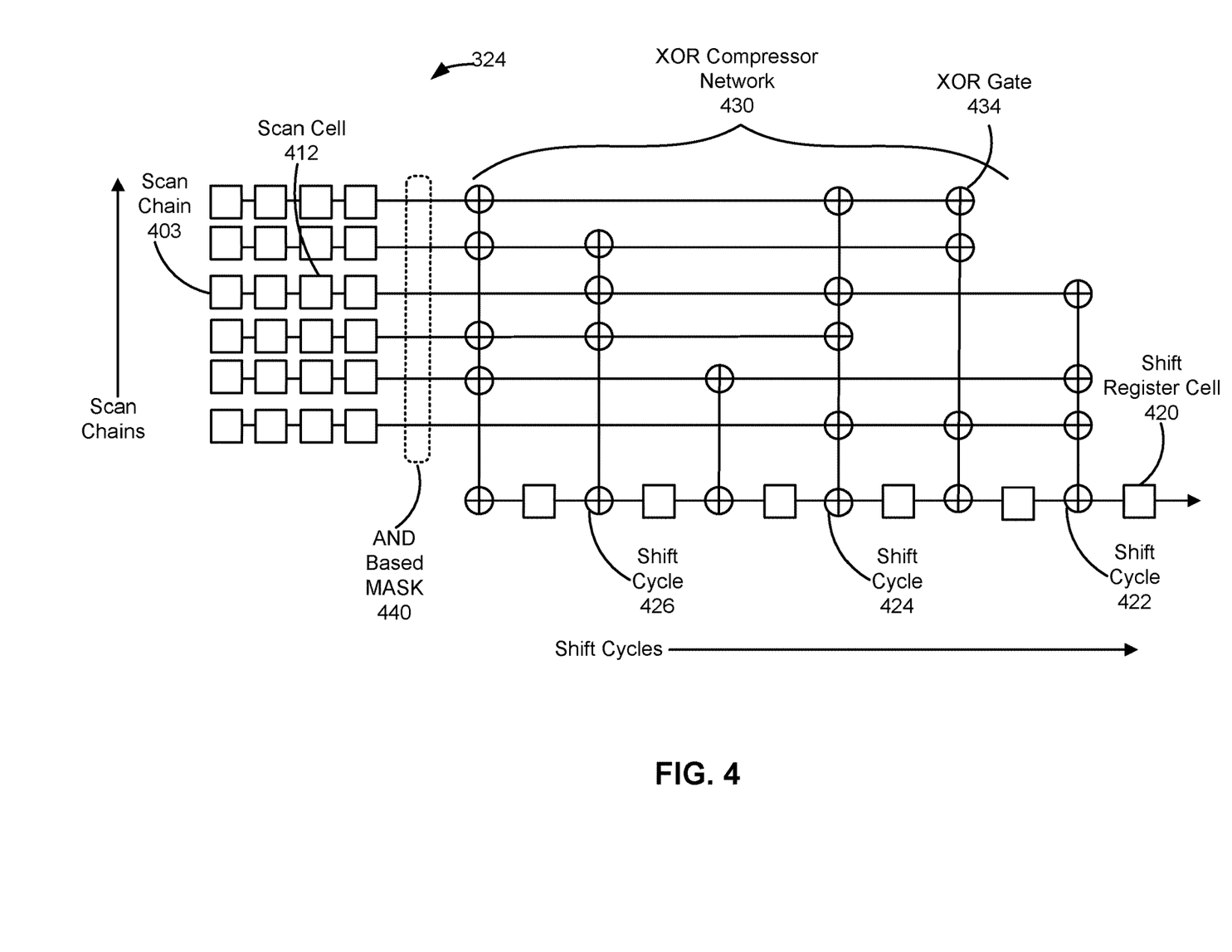
FIG. 4 is a circuit diagram of an example integrated circuit including scan cells and a convolutional compactor, in accordance with an embodiment.

FIG. 4 is a circuit diagram of an example integrated circuit 324 including scan cells and a convolutional compactor, in accordance with an embodiment. The example integrated circuit 324 includes scan cells (e.g., 412), scan chains (e.g., 403), an AND-based mask 440, and an XOR compressor network 430. The XOR compressor network 430 includes XOR gates (e.g., 434) and shift register cells (e.g., 420).

Information is received describing test response signals generated by the scan cells of the integrated circuit 324 and physical shift failures representing mismatches between the test response signals and expected test response signals of the integrated circuit 324. A scan design is used to make it easier to test the integrated circuit 324 by providing a simple way to set and observe every scan cell in the integrated circuit 324. Each scan cell in the integrated circuit 324 is connected in one of the scan chains (e.g., 403). When a special scan enable signal is asserted, every scan cell in the integrated circuit 324 is connected into one of the scan chains. Test pattern signals 308 are applied to the scan cells of the integrated circuit 324 to determine whether the integrated circuit 324 has physical faults located within it. A test pattern signal may be a set of digital 1 and 0 values or analog voltage and current values. When the resulting test response signals are associated with physical shift failures in the shift register cells (e.g., 420), fault diagnosis is used to narrow down the possible locations of physical faults.

Fault diagnosis is used to learn the cause of integrated circuit failures and physical fault locations with the goal of ramping up manufacturing yield. The fault diagnosis of the integrated circuit 423, which includes scan cells and a compressor 430, is performed in two steps. In the first step, physical shift failures identified on the ATE 320 are mapped back through the compressor 430 to the scan cells. In the second step, scan-based fault diagnosis is performed with a fault simulation engine 304, considering faults in cones of logic of the mapped scan cells. The embodiments disclosed herein represent an improved failure mapping process for fault diagnosis.

In an embodiment, the test response signals are obtained by compressing output signals of the scan cells using a convolutional compactor. FIG. 4 shows an example convolution compactor with one output containing six shift register cells (e.g., 420) driven by six scan chains (e.g., 403). The XOR compressor network 430 may operate as a convolutional compactor for efficient test response compression. The XOR compressor network 430 includes two parts. The first part consists of single-output XOR compressor networks (e.g., 434) that are added to the outputs of the internal scan chain outputs. In an embodiment, the compressor 430 may be based on Steiner Triple Systems and designed to tolerate up to two Xs per shift with no loss of observability on other chains. The AND-based X-masking network 440 may also be included to compact test response signals. The second part consists of a shift register in which the outputs of the XORs (e.g., 434) are connected. The shift register cells (e.g., 420) perform another set of compression over the XOR compressor outputs.

The failing scan cells associated with shift failures may be identified from the compressed scan output signals generated using a scalable adaptive scan architecture based on convolution compactors. Physical shift failures that occur in the compacted test response signals from the scan chains are examined and these failures are mapped back to failing scan cells. For example, faulty compressed test response signals may include fault effects from either a single scan cell, from multiple scan cells with independent effects, or from multiple scan cells with mixed effects in the compressor 430.

The compressor 430 can cause aliasing in the test response signals. When a logic error value is captured in a single scan cell, the physical shift failure will be visible at the outputs of the compressor 430 in a unique combination of shift cycles (e.g., 422 and 426). The unique combination of the shift cycles for a particular scan cell is known as the signature of the cell. Therefore, when a single cell captures an error, the failing scan cell may be identified from the compressed faulty test response signals and failure mapping can be performed. However, when multiple scan cells simultaneously capture logic error values for a test pattern signal 308, the inherent distinctiveness of a scan cell may not be preserved. This can lead to incorrect failure mapping due to the aliasing of different scan cell signatures.

In the convolution compactor shown in FIG. 4, every scan cell's output becomes visible in the test response signals in three possible shift cycles. These three shift cycles are referred to as the impacted shift list of the scan cell. For example, a logic error value in scan cell 412 of scan chain 403, will reach the shift cycles 422, 424, and 426. This combination of shift cycles in which the effect of a scan cell reaches is unique for every scan cell in the integrated circuit 324. Therefore, if a physical shift failure is associated with a single scan cell, the failing scan cell may be identified from the compressed test response signals from the shift register cells.

When a physical fault is located within an integrated circuit, it may cause several failing test response signals. However, for effective diagnosis, not all failing test response signals are needed for analysis. Limiting the number of test response signals that are used assists in accurately locating the physical fault. The reason is the aliasing of physical shift failures caused by the compressor network 430. Although convolution compactors can reduce aliasing, they cannot eliminate it. Because of the aliasing, the association between compressor outputs and scan cells may not be unique. Therefore, each failing test response signal is analyzed separately before mapping it to scan cells.

The test response signals are mapped to a subset of the scan cells associated with the physical shift failures. In one embodiment, a greedy, branch-and-bound method may be used for the mapping of test response signals to scan cells. A data structure is created based on a matrix that stores a list of scan cells that can affect a particular shift cycle at the compressor 403 outputs. From a failing test response signal, the mismatched shift cycles corresponding to physical failures are identified. Each scan cell is assigned a weight based on a number of physical shift failures corresponding to that scan cell. The maximum weight of a particular scan cell is three, since any scan cell can affect three shift cycles. Once the weight is calculated for each scan cell, the scan cell having a maximum weight is selected. The error response is modified by setting the "1" physical shift failures that correspond to the scan cell, to "0." The weights of the remaining scan cells are calculated based on the modified error response. The procedure repeats until all the physical shift failures in the error response are set to zero.

Each scan cell is associated with three different weights: (i) explain failure bit weight, (ii) X weight, and (iii) explained pattern weight. The explain failure bit weight is the number of physical shift failures corresponding to the scan cell, as described above. The X weight of a scan cell is the number of bits in the X response that are in the scan cell's impacted shift list. The presence of X's can change the failure response as well as the error signature. For example, consider a single scan cell failure resulting in a three-bit failure at the compressor output. Due to the presence of an X, the failure is cancelled for one shift cycle. Therefore, several scan cells along with the correct scan cell will have explain failure bit weight equal to two. However, the correct scan cell will have an X weight, which can be used to identify the scan cell. Therefore, X's are addressed in the mapping algorithm. The explained pattern weight for a scan cell is a count of test response signals the scan cell is associated with. This weight is used to prune the subset of mapped scan cells when there is no distinct scan cell to identify.

The mapping uses two variables—Used and Selected List for the mapping. Used is a marker for every scan cell. The variable indicates whether the scan cell has already been used in creating the mapping. If the scan cell has already been used in creating the mapping, then the scan cell is not selected again. Selected List is a stack data structure used to store scan cells at different depths of the mapping solution. The variable is very useful for back tracing when it is impossible to select a new scan cell. Then, the scan cell at the top of the Selected List is removed and the mapping tries a different path to identify a solution. The mapping limits the number of mapping scan cells for a test response signal depending on the number of physical shift failures. Since each scan cell can be associated with three physical shift failures, an initial value for the scan cell limit is obtained by dividing the number of physical shift failures by 3. The mapping attempts to identify a solution within this scan cell limit. If unable to do so, the scan cell limit is increased by one and the mapping re-starts from the beginning. The mapping search is limited to two more scan cells from the initial value to reduce the runtime for the mapping.

Physical shift failures associated with the test response signals may be grouped as follows. A test response may be associated with physical shift failures from (i) a single scan cell (type I), (ii) multiple scan cells with their effects independent of each other (type II), or (iii) multiple scan cells with their effects cancelling each other at some shift cycles (type III). These three groups are identified and treated separately. Using the convolution compaction, a scan cell may affect three distinct shift cycles in the test response signals. Therefore, if a test response signal is associated with three physical shift failures, it is likely that the physical shift failures originate from a single scan cell. This distinctiveness property is used by the mapping to identify the scan cell to be mapped.

The embodiments disclosed herein may be used for all three groups in different passes. In a first pass, test response signals associated with three physical shift failures are identified and mapped to scan cells. In a second pass, test response signals associated with multiples of three failures are identified. Because the distinctiveness of individual scan cells is preserved, the mapping of these test response signals is safe. A safe mapping refers to a mapping from test response signals to scan cells where there is a high probability that the physical fault is located within a logic cone of the mapped scan cells. Therefore, if fault simulation is performed for the mapped scan cells, the physical fault is highly likely to be identified. In a third pass, if not enough failing test response signals are mapped by the previous passes, type III test response signals (multiple scan cells with their effects cancelling each other at some shift cycles) are mapped. The information gathered from the first two passes is used to prune out the false candidate scan cells in the third pass. Performing the mapping over many passes helps to target the test response signals that are safe to map first and use the results from the earlier passes. Test response signals that are safe to map have a high probability of being associated with scan cells that capture logic error values from the physical faults. Therefore, if test pattern signals corresponding to these test response signals are simulated, it is highly likely that the physical fault will be identified. The chances of mapping incorrect scan cells are therefore reduced and there is reduced impact on processing time.

In some special cases, incorrect scan cell mapping is addressed using fault simulation. For example, consider two test response signals, in which test response signal 1 is associated with three physical shift failures, which are successfully mapped back to a scan cell k1. Test response signal 2 is associated with four shift failures, and there may be two sets of scan cells: {k2, k3} or {k4, k5}, which can be mapped for test response signal 2. Information to distinguish the correct set of scan cells may not be present. In this case, the mapping for test response signal 2 is skipped or one of the scan cell pairs is chosen at random. Fault simulation is used to address potentially incorrectly mapped scan cells, as described in detail below with reference to FIGS. 5A and 5B.

Example Scan Diagnosis in Integrated Circuit

Figure 5A:
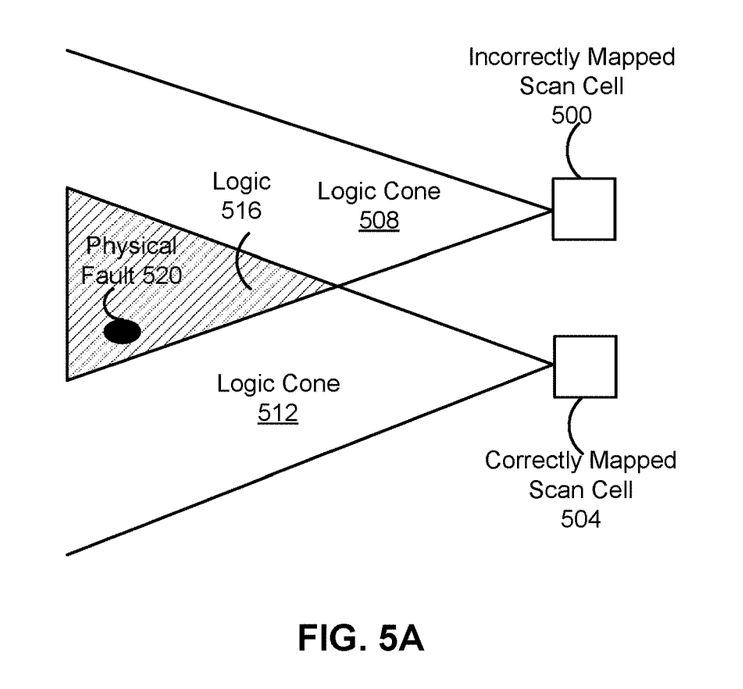
FIG. 5A is an example circuit diagram illustrating scan diagnosis for a physical fault located within a logic cone of an incorrectly mapped scan cell, in accordance with an embodiment.

FIG. 5A is an example circuit diagram illustrating scan diagnosis for a physical fault 520 located within a logic cone 508 of an incorrectly mapped scan cell 500, in accordance with an embodiment. FIG. 5A includes the incorrectly mapped scan cell 500, a correctly mapped scan cell 504, the logic cone 508 of scan cell 500, a logic cone 512 of scan cell 504, logic gates and nodes 516 located within the logic cones 508 and 512, and the physical fault 520.

Once the test response signals are mapped to scan cells, scan diagnosis is used to identify physical faults located within the integrated circuit. In one embodiment, the identifying of the physical faults includes storing a fault list including potential faults located within the integrated circuit. Each potential fault is associated with one or more scan cells. In the scan diagnosis process, a fault list including potential faults may be generated by a logic cone tracing from the mapped scan cells.

A potential fault is a logical model of a physical defect in an integrated circuit, from which the consequences of the physical defect may be predicted. For example, potential faults in an integrated circuit may include stuck-at faults (a wire is stuck at a 0 or 1 value, independent of the inputs to the integrated circuit), bridging faults (two wires are connected together when they should not be), transistor faults (potential faults for CMOS logic gates, such as stuck-short or stuck-open), open faults (a wire is broken and one or more inputs are disconnected from the output that should drive them), and delay faults (a signal eventually assumes the correct value, but more slowly than normal). A fault list is a set of potential faults for a logic cone.

If scan cells are incorrectly mapped, there may be two possibilities as follows. First, the physical fault causing the physical shift failures associated with the test response signals may be present in the fault list generated by the logic cone tracing. Second, the physical fault may not be present in the fault list. Both possibilities may lead to a degradation in the diagnostic results and are therefore addressed using fault simulation. Fault simulation is performed for the mapped scan cells using the test pattern signals to identify physical faults located within the integrated circuit.

FIG. 5A illustrates the case in which a potential fault corresponding to the physical fault 520 is present in the fault list after logic cone tracing. Even though the test response signals should have been correctly mapped to scan cell 504, the test response signals were incorrectly mapped to the scan cell 500. The physical fault 520 is located within the logic gates and nodes 516 in the intersection of the logic cones 508 and 512. Because the physical fault 520 is located within the logic cone 508 of scan cell 500, therefore the potential fault corresponding to the physical fault 520 is present in the fault list generated from scan cell 500. The potential fault corresponding to the physical fault 520 may be present in the fault list for several reasons. A physical fault may be located within the traced part of an integrated circuit, as illustrated in FIG. 5A. Alternatively, a test response signal may have been correctly mapped to scan cell 504. Therefore, mapping only a subset of the test response signals assists in keeping the potential fault corresponding to the physical fault 520 in the fault list.

In one embodiment, scores are determined for the potential faults based on a number of the one or more scan cells associated with physical shift failures, and further based on a number of the one or more scan cells associated with simulation failures based on the performing of the fault simulation. A score is calculated for each potential fault in the fault list, indicating whether the potential fault is physically present in the integrated circuit. In an embodiment, the score for a potential fault is determined based on three metrics for a simulated pattern. The first parameter, TFSF (Tester fail-Simulation fail), refers to a number of mapped scan cells that are associated with physical shift failures as well as with simulation failures during the fault simulation. The second parameter, TFSP (Tester fail-Simulation pass), refers to a number of scan cells associated with physical shift failures but not with simulation failures during the fault simulation. The third parameter, TPSF (Tester pass-Simulation fail), refers to a number of scan cells not associated with physical shift failures but associated with simulation failures during the fault simulation.

Fault simulation is performed and the metrics (TFSF, TFSP, and TPSF) are calculated for the potential faults. In an embodiment, the following determination may be made for the score for a potential fault over all test response signals: Score=(TFSF/(TFSF+TFSP+TPSF))×100%. If the mapping of test response signals to scan cells is correct, the values of TFSP and TPSF will be zero when the potential fault is present as a physical fault in the integrated circuit 324, and the potential fault will have a score equal to 100%. The presence of incorrectly mapped scan cells reduces the score for a potential fault. Continuing with the example described above with reference to FIG. 4, {k4, k5} may be the correct mapping. However, the test response signals may have been mapped to scan cells {k2, k3}. If the potential fault, which is also present as a physical fault in the integrated circuit 324, is simulated using the test pattern signals, it would result in error values in scan cells {k4, k5}. However, these scan cells are assumed to be fault free after the mapping is performed. Therefore, the simulation will result in a non-zero TPSF value. Similarly, scan cells {k2, k3} will lead to a non-zero TFSP value using the physical shift failures associated with the test response signals. Such mismatches may reduce the score of a physical fault, leading to incorrect diagnosis.

Therefore, in an embodiment, only if the scores exceed a threshold, the potential faults are reported as physical faults. For example, scores of greater than 80% may be used when reporting potential faults as physical faults when no other potential faults have a score higher than the physical fault. This thresholding is based on the principle that scan cells that are associated with logic errors during fault simulation using test pattern signals will produce exactly the same physical shift failures associated with the compressed test response signals obtained by the ATE 320 for the test pattern signals if the simulated potential fault corresponds to the physical located in the integrated circuit 324.

The thresholding is further based on the principle that if a simulated fault corresponds to a physical fault located in the integrated circuit 324, the compressed test response signals at the outputs of the compressor 430 will also match. The problem of matching simulation failures to physical shift failures would be solved if the fault simulation is performed to the outputs of the compressor 430 instead of performing the fault simulation to the scan cells. However, performing fault simulation to the outputs of the compressor 430 significantly increases the runtime for a convolution compactor, particularly because the fault simulation is to be performed for every potential fault using every test pattern.

In an embodiment, a hash-based function is used to resolve this problem. Hash values are determined for the test response signals based on physical shift failures associated with the test response signals. Each hash value corresponds to one or more of the potential faults. The one or more of the potential faults are reported as physical faults based on the hash values. In another embodiment, for each test response signal, hash values are determined based on the performing of the fault simulation. The one or more of the potential faults are reported as physical faults based on the hash values.

The hash function is dependent on the shift cycles (e.g., 422, 424, and 426) and the corresponding output values in the compressed failure log. Hash values are generated for different test pattern signals. Two test pattern signals may have the same hash values if they have exactly the same compressed failure response. These hash values are used to address the problem of incorrectly mapped scan cells.

An example hash function may be expressed as Value=HashFunc(<$O_{i1}$, $S_{j1}$>, <$O_{i2}$, $S_{j2}$>, . . . ). In this example, the hash function receives a set of tuples of the form <$O_i$, $S_j$>, where $O_i$ indicates the compressor 430's output and $S_j$ indicates the shift cycle in which a physical shift failure is observed at output $O_i$ for a failing test response signal. Therefore, for a failing test response signal, every shift position and its corresponding compressor output are considered to determine the hash value for the test response signal. The hash value for the test response signal is used for comparisons during fault simulation.

The logic value in each scan cell value is propagated to a unique combination of shift cycles (typically three cycles). Therefore, a structure is created for each scan cell that holds the impacted shift cycles along with the corresponding output. During diagnosis fault simulation, the information in this structure is used to calculate the shift cycles with the corresponding outputs from the scan cells. The hash function is used to calculate the hash value Value for the shift cycles. If Value is the same as that for the simulated failing test pattern signal and the potential fault is simulated to the outputs of the compressor 430, the simulated test response signal will match the compressed test response signal observed on the ATE 320.

Continuing with the above example, when the potential fault corresponding to the physical fault 520 is simulated for the second test pattern, the scan cells {k4, k5} will capture the error value originating from the potential fault. The shift cycles for scan cell k4 and scan cell k5 are determined separately and the combined response is determined. The combined response is determined because some shift cycles may be present in the impacted list for both scan cells and cancel each other. Once the combined shift values are determined, the hash value of these shift values are determined using the same hash function. Since the simulated potential fault corresponds to the physical fault 520, the simulation hash value will match the hash value of the failing test response signal. Once the hash values match, the TPSF value and TFSP value for the test response signal for the simulated potential fault and physical fault 520 are adjusted. Therefore, the score for the physical fault 520 will be 100%. Any incorrect mapping of test response signals to scan cells may therefore be addressed during the fault simulation process.

The integrated circuit 324 may fail when its observed behavior is different from its expected behavior. The diagnosis consists of locating the physical faults in a structural model of the integrated circuit. The degree of accuracy to which physical faults can be located is called diagnostic resolution. Because the hash function used is strong enough to avoid aliasing between different compressed test response signals, the embodiments disclosed herein do not impact the diagnostic resolution. Consider scan cells whose values are combined to provide the same shift cycles. Continuing with the example above, scan cells {k2, k3} will have the same shift combination. Therefore, a fault that propagates error values in scan cells {k2, k3} for the failing test response signals, will have the same hash value. If the same fault matches the hash values for every test response signal, the fault will also have a 100% score. Therefore, the inability to distinguish between faults due to the compressor structure does not affect the diagnostic resolution.

The embodiments disclosed above for single faults may be applied for integrated circuits containing multiple faults. Therefore, the embodiments are not limited to identification of single faults. The embodiment in which the physical fault 520 is not present in the fault list after cone tracing is described in detail below with respect to FIG. 5B.

Safe Cell Mapping

Figure 5B:
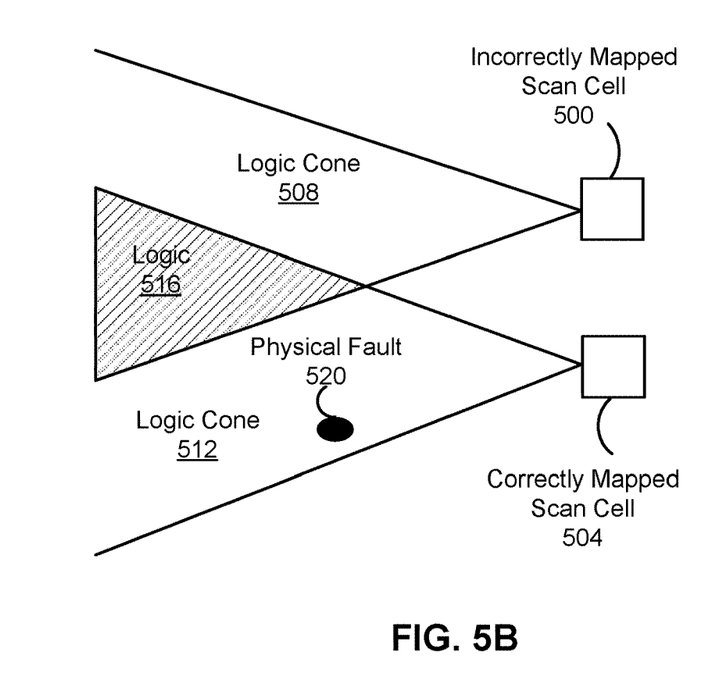
FIG. 5B is an example circuit diagram illustrating scan diagnosis for a physical fault located outside a logic cone of an incorrectly mapped scan cell, in accordance with an embodiment.

FIG. 5B is an example circuit diagram illustrating scan diagnosis for a physical fault 520 located outside a logic cone 508 of an incorrectly mapped scan cell 500, in accordance with an embodiment. A potential fault corresponding to the physical fault 520 may not be present in the fault list generated for logic cone 508 when not even a single test response signal was mapped correctly. Although rare, this situation can occur when the mapping fails to map any test response signals after the second pass, as described above with respect to FIG. 4. In this situation, all the test response signals are of type III (multiple scan cells with their effects cancelling each other at some shift cycles) and there is no distinct combination of scan cells associated with the physical shift failures. This situation is illustrated in FIG. 5B with one correctly mapped scan cell 504 and one incorrectly mapped scan cell 500.

Since the physical fault 520 is located outside the logic cone 508 of the incorrectly mapped scan cell 500, a potential fault corresponding to the physical fault 520 will not be present in the fault list after logic cone tracing. To solve this problem, the mapping of the test response signals to scan cells is modified to ensure that the potential fault corresponding to the physical fault 520 is present in the fault list after logic cone tracing. The modified mapping is referred to as safe cell mapping. Safe cell mapping is used to identify and map a single scan cell for failing test response signals associated with a high number of physical shift failures. The mapped single scan cell has a high probability of being associated with the physical shift failures as well as a physical fault. Therefore, if test pattern signals are fault simulated for the safe scan cell, it is highly likely that the physical faults will be identified.

After one or more test response signals are mapped to a scan cell (e.g., 500), a logic cone (e.g., 508) input to the mapped scan cell is traced to identify potential faults in the logic that drives the scan cell. When more than one scan cell is mapped, an intersection (e.g., logic 516) of the more than one traced cones (e.g., 508 and 512) is generated and a fault list of potential faults is prepared from the intersection. For example, assume that two scan cells are mapped for a failing test response signal. One of the scan cells 504 is mapped correctly and the other scan cell 500 is incorrect. When logic cone tracing is performed for both the scan cells and the intersection logic 516 is generated, the potential fault corresponding to the physical fault 520 may not be present in the fault list, as illustrated in FIG. 5B. Therefore, only a single cell is mapped when the association between scan cells and physical shift failures is weak.

In an embodiment, the mapping of the test response signals to the subset of the scan cells includes identifying physical shift failures associated with distinct scan cells. The distinct scan cells are included in the subset of the scan cells. A safe cell may be determined based on the number of distinct shift cycles each scan cell can impact. The number of distinct shift cycles is determined based on the fact that some physical shift failures in the test response signals may be associated with only a single scan cell. This single scan cell is identified and selected to be part of the mapping because a shift cycle may be impacted by many scan cells but not all scan cells should be selected for the mapping. Therefore, the single scan cell identified as above lies in all the possible mapping solutions and is considered a good candidate for a safe cell.

However, determining all possible solutions for the mapping is not always feasible. Especially, when there are a large number of physical shift failures associated with a single test response signal, it may be costly in terms of runtime and memory requirements to determine all possible solutions. In the integrated circuit 324, a wire or a gate output may be connected to several inputs. The technology used to implement logic gates usually allows a certain number of gate inputs to be wired directly together without additional interfacing circuitry. The number of logic gate inputs driven by a wire or gate measures its load-driving capability—it is the greatest number of inputs of gates of the same type to which the output can be safely connected. For example, suppose a failing test response signal is associated with 1000 physical shift failures for a physical fault having high fan-out (the number of logic gate inputs driven by the wire or gate associated with the physical fault). If each scan cell can impact three shift cycles, there will be around 335 scan cells that combine to generate the test response signals, leading to a large number of possible mapping solutions for the scan cells.

In an embodiment, the mapping of the test response signals to the subset of the scan cells includes identifying physical shift failures associated with distinct scan cells. A distinct scan cell associated with a largest number of the physical shift failures associated with the distinct scan cells is identified. The identified distinct scan cell is included in the subset of the scan cells. To identify a good candidate scan cell for the mapping, only those scan cells whose impacted shift cycles (usually three shift cycles) are all present in the test response signals are considered. The distinct scan cell (among the selected scan cells) that has a highest number of unique shift cycles is identified, and the scan cell is mapped. Don't care bits (Xs) are not considered. Therefore, the physical shift failures associated with a test response signal are generated by bitwise exclusive-or operations between faulty shift cycles in the failure log and Xs in the scan cell outputs. Thus, X-masking of failure responses is taken into account.

In one embodiment, the mapping of the test response signals to the subset of the scan cells includes identifying a scan cell associated with physical shift failures associated with a largest number of the test response signals. The identified scan cell is included in the subset of the scan cells. If there are no distinct scan cells having unique shift cycles, all the failing test response signals are used to identify a distinct scan cell associated with a largest number of failing test response signals. The distinct scan cell is selected and mapped to all the test response signals associated with the distinct scan cell. In this manner, the situation in which it is not possible to find a suitable candidate scan cell for safe cell mapping is addressed.

In an embodiment, the mapping method described above with reference to FIG. 4 is performed in two passes. If there is at least one mapped test response signal after two passes, a third pass is used. If no test response signals are mapped after two passes, safe cell mapping is used. Therefore, the runtime overhead is reduced and safe cell mapping leads to a negligible overall time impact.

The embodiments disclosed herein address the situations in which the regular mapping does not produce correct results. The embodiments map only a single cell (even if the physical shift failures originate from multiple scan cells). The embodiments are therefore able to address mapping test response signals to scan cells for test response signals associated with more than 1000 physical shift failures, and can successfully identify physical faults with 100% score in integrated circuits. The embodiments readily address the problem of physical fault identification for compressor-based scan diagnosis.

The benefits and advantages of the embodiments disclosed herein are that the effects of incorrect mapping are analyzed and used during the fault simulation process of fault diagnosis. Safe cell mapping is used to apply failure mapping to a single scan cell for a test pattern with high failures. The embodiments use the incorrect mapping solution to improve the diagnosis results. Instead of mapping every failing test response, the embodiments map a subset of the test response signals with higher confidence for better diagnosis accuracy. The unmapped failing test pattern signals are simulated to return to achieve high diagnostic resolution.

Fault Simulation Using Unmapped Test Pattern Signals

Scan diagnosis typically uses all the test pattern signals to identify the location of physical faults. However, for compressor-based scan diagnosis, fewer test response signals are mapped because incorrect mapping may lead to incorrect diagnosis results. Therefore, only those test response signals having a higher confidence value are mapped for compressor-based scan diagnosis. However, when not all failing test pattern signals are used, diagnostic resolution could be lowered. There may exist an unmapped test response signal that may distinguish between the physical fault and another reported potential fault, leading to higher diagnostic resolution. Therefore, test pattern signals corresponding to unmapped test response signals are also used in the fault simulation as follows.

Fault simulation is performed for the mapped subset of the scan cells to identify physical faults located within the integrated circuit causing the physical shift failures. The process of mapping test response signals to scan cells and performing fault simulation described above is referred to as "map less—simulate more." This process is used to map test response signals with a high confidence level. Therefore, the probability that a potential fault corresponding to the physical fault is present in the fault list before fault simulation is increased.

In this embodiment, the identifying of the physical faults includes storing a fault list including potential faults located within the integrated circuit. Simulation hash values are determined for the test response signals based on the performing of the fault simulation. Each simulation hash value corresponds to one or more of the potential faults. Physical hash values are determined based on physical shift failures associated with the test response signals. Responsive to a simulation hash value matching a physical hash value, the corresponding one or more of the potential faults are reported as physical faults.

In the fault simulation process, the unmapped test patterns are fault simulated to increase the diagnostic resolution. When a potential fault propagates a logical error value to the scan cells, simulation hash values are determined as described above with reference to FIG. 5A. The simulation hash values are compared to the physical hash values. Based on the comparison, the metrics (TFSF, TPSF, and TFSP) are determined and used to determine the score for the potential fault. Therefore, by fault simulating test pattern signals corresponding to unmapped test response signals, the diagnostic resolution is increased.

Figure 6:
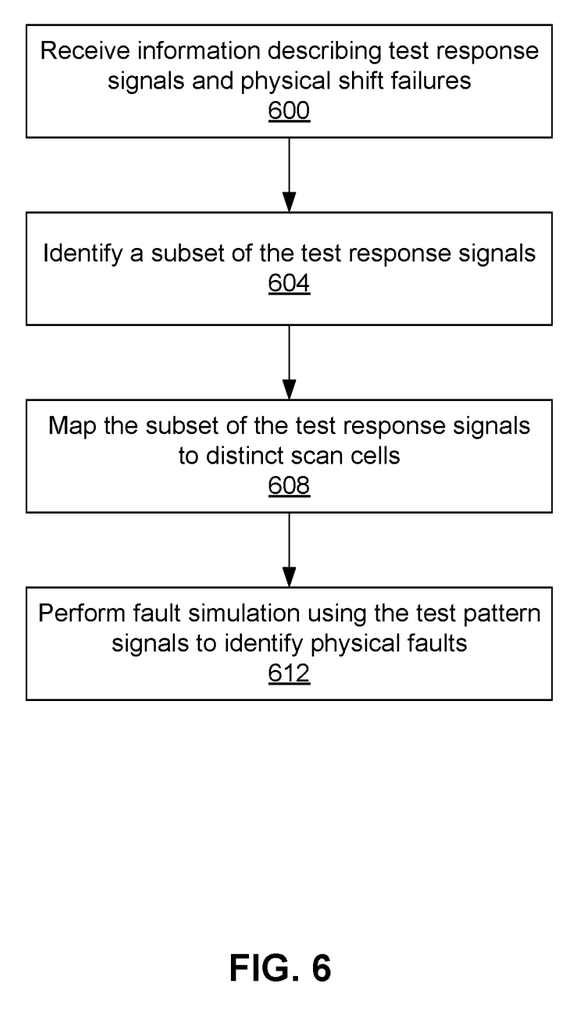
FIG. 6 is a flowchart illustrating a process for mapping of physical shift failures to scan cells for identification of physical faults in integrated circuits, in accordance with an embodiment.

Example Process for Mapping Physical Shift Failures to Scan Cells for Identifying Faults FIG. 6 is a flowchart illustrating a process for mapping of physical shift failures to scan cells for identification of physical faults in integrated circuits. In some example embodiments, the process may have different and/or additional steps than those described in conjunction with FIG. 6. Steps of the process may also be performed in different orders than the order described in conjunction with FIG. 6. Some steps may be executed in parallel. Alternatively, some of the steps may be executed in parallel and some steps executed sequentially. Alternatively, some steps may execute in a pipelined fashion such that execution of a step is started before the execution of a previous step.

Information is received 600 describing test response signals generated by an integrated circuit 324 in response to test pattern signals 308 applied to scan cells (e.g., 412) of the integrated circuit 324. The information further describes physical shift failures representing mismatches between the test response signals and expected test response signals of the integrated circuit 324. A subset of the test response signals associated with physical shift failures associated with distinct scan cells of the scan cells (e.g., 412) of the integrated circuit 324 is identified 604.

The subset of the test response signals is mapped 608 to one or more of the distinct scan cells. Fault simulation is performed for the mapped one or more of the distinct scan cells using the test pattern signals to identify physical faults (e.g., 500) located within the integrated circuit 324. The physical faults cause one or more of the physical shift failures.

Finally, the language used in the specification has been principally selected for readability and instructional purposes, and it may not have been selected to delineate or circumscribe the inventive subject matter. It is therefore intended that the scope be limited not by this detailed description, but rather by any claims that issue on an application based hereon. Accordingly, the disclosure of the embodiments is intended to be illustrative, but not limiting, of the scope, which is set forth in the following claims.

What is claimed is:

1. A computer-implemented method, comprising:
   receiving information describing test response signals generated by an integrated circuit in response to test pattern signals applied to scan cells of the integrated circuit, the information further describing physical shift failures representing mismatches between the test response signals and expected test response signals of the integrated circuit;
   identifying a subset of the test response signals associated with physical shift failures associated with distinct scan cells of the scan cells of the integrated circuit;

mapping the subset of the test response signals to one or more of the distinct scan cells;

performing fault simulation for the mapped one or more of the distinct scan cells using the test pattern signals to identify physical faults located within the integrated circuit, the physical faults causing one or more of the physical shift failures;

storing a fault list comprising potential faults located within the integrated circuit, each potential fault associated with one or more scan cells; and determining scores for the potential faults based in part on at least one of (a) a number of scan cells associated with physical shift failures but not with simulation failures, and (b) a number of scan cells not associated with physical shift failures but associated with simulation failures.

2. The computer-implemented method of claim 1, wherein the mapping of the subset of the test response signals to the one or more of the distinct scan cells comprises:
identifying a distinct scan cell associated with a largest number of the physical shift failures associated with the distinct scan cells; and
including the identified distinct scan cell in the mapping.

3. The computer-implemented method of claim 1, wherein the scores for the potential faults are further based on:
a number of the one or more scan cells associated with physical shift failures, and further based on a number of the one or more scan cells associated with simulation failures based on the performing of the fault simulation.

4. The computer-implemented method of claim 1, wherein the identifying of the physical faults comprises:
storing a fault list comprising potential faults located within the integrated circuit;
determining simulation hash values for the test pattern signals based on the performing of the fault simulation, each simulation hash value corresponding to one or more of the potential faults;
determining physical hash values based on physical shift failures associated with the test pattern signals; and
responsive to a simulation hash value for a test pattern signal matching a physical hash value, identifying the corresponding one or more of the potential faults as physical faults.

5. A computer-implemented method, comprising:
receiving information describing test response signals generated by scan cells of an integrated circuit and physical shift failures representing mismatches between the test response signals and expected test response signals of the integrated circuit;
mapping the test response signals to a subset of the scan cells associated with the physical shift failures; and
performing fault simulation for the mapped subset of the scan cells to identify physical faults located within the integrated circuit causing the physical shift failures;
storing a fault list comprising potential faults located within the integrated circuit, each potential fault associated with one or more scan cells; and
determining scores for the potential faults based in part on at least one of (a) a number of scan cells associated with physical shift failures but not with simulation failures, and (b) a number of scan cells not associated with physical shift failures but associated with simulation failures.

6. The computer-implemented method of claim 5, wherein the test response signals are obtained by compressing output signals of the scan cells using a convolutional compactor.

7. The computer-implemented method of claim 5, wherein the mapping of the test response signals to the subset of the scan cells comprises:
identifying physical shift failures associated with distinct scan cells; and
including the distinct scan cells in the subset of the scan cells.

8. The computer-implemented method of claim 5, wherein the mapping of the test response signals to the subset of the scan cells comprises:
identifying physical shift failures associated with distinct scan cells;
identifying a distinct scan cell associated with a largest number of the physical shift failures associated with the distinct scan cells; and
including the identified distinct scan cell in the subset of the scan cells.

9. The computer-implemented method of claim 5, wherein the mapping of the test response signals to the subset of the scan cells comprises:
identifying a scan cell associated with physical shift failures associated with a largest number of the test response signals; and
including the identified scan cell in the subset of the scan cells.

10. The computer-implemented method of claim 5, wherein the scores for the potential faults are further based on:
a number of the one or more scan cells associated with physical shift failures, and further based on a number of the one or more scan cells associated with simulation failures based on the performing of the fault simulation.

11. The computer-implemented method of claim 5, wherein the identifying of the physical faults comprises:
storing a fault list comprising potential faults located within the integrated circuit, each test response signal associated with one or more of the potential faults;
determining hash values for the test response signals based on physical shift failures associated with the test response signals; and
reporting the one or more of the potential faults as physical faults based on the hash values.

12. The computer-implemented method of claim 5, wherein the identifying of the physical faults comprises:
storing a fault list comprising potential faults located within the integrated circuit;
for each test response signal, determining hash values based on the performing of the fault simulation, each hash value corresponding to one or more of the potential faults; and
reporting the one or more of the potential faults as physical faults based on the hash values.

13. The computer-implemented method of claim 5, wherein the identifying of the physical faults comprises:
storing a fault list comprising potential faults located within the integrated circuit;
determining simulation hash values for the test response signals based on the performing of the fault simulation, each simulation hash value corresponding to one or more of the potential faults;
determining physical hash values based on physical shift failures associated with the test response signals; and responsive to a simulation hash value matching a physical hash value, identifying the corresponding one or more of the potential faults as physical faults.

14. A non-transitory computer-readable storage medium comprising instructions executable by a processor, the instructions comprising instructions for:

receiving information describing test response signals generated by scan cells of an integrated circuit and physical shift failures representing mismatches between the test response signals and expected test response signals of the integrated circuit;

mapping the test response signals to a subset of the scan cells associated with the physical shift failures; and performing fault simulation for the mapped subset of the scan cells to identify physical faults located within the integrated circuit causing the physical shift failures;

storing a fault list comprising potential faults located within the integrated circuit, each potential fault associated with one or more scan cells; and determining scores for the potential faults based in part on at least one of (a) a number of scan cells associated with physical shift failures but not with simulation failures, and (b) a number of scan cells not associated with physical shift failures but associated with simulation failures.

15. The non-transitory computer-readable storage medium of claim 14, wherein the mapping of the test response signals to the subset of the scan cells comprises:

identifying physical shift failures associated with distinct scan cells; and including the distinct scan cells in the subset of the scan cells.

16. The non-transitory computer-readable storage medium of claim 14, wherein the mapping of the test response signals to the subset of the scan cells comprises:

identifying physical shift failures associated with distinct scan cells;

identifying a distinct scan cell associated with a largest number of the physical shift failures associated with the distinct scan cells; and including the identified distinct scan cell in the subset of the scan cells.

17. The non-transitory computer-readable storage medium of claim 14, wherein the mapping of the test response signals to the subset of the scan cells comprises:

identifying a scan cell associated with physical shift failures associated with a largest number of the test response signals; and including the identified scan cell in the subset of the scan cells.

18. The non-transitory computer-readable storage medium of claim 14, wherein the scores for the potential faults are further based on:

a number of the one or more scan cells associated with physical shift failures, and further based on a number of the one or more scan cells associated with simulation failures based on the performing of the fault simulation.

19. The non-transitory computer-readable storage medium of claim 14, wherein the identifying of the physical faults comprises:

storing a fault list comprising potential faults located within the integrated circuit, each test response signal associated with one or more of the potential faults;

determining hash values for the test response signals based on physical shift failures associated with the test response signals; and reporting the one or more of the potential faults as physical faults based on the hash values.

20. The non-transitory computer-readable storage medium of claim 14, wherein the identifying of the physical faults comprises:

storing a fault list comprising potential faults located within the integrated circuit;

for each test response signal, determining hash values based on the performing of the fault simulation, each hash value corresponding to one or more of the potential faults; and reporting the one or more of the potential faults as physical faults based on the hash values.

* * * * *